United States Patent [19]

Vander Zanden et al.

[11] Patent Number: 5,541,850
[45] Date of Patent: Jul. 30, 1996

[54] METHOD AND APPARATUS FOR FORMING AN INTEGRATED CIRCUIT INCLUDING A MEMORY STRUCTURE

[75] Inventors: Nels B. Vander Zanden, Mountain View; Mossaddeq Mahmood, San Jose, both of Calif.

[73] Assignee: VLSI Technology, Inc., San Jose, Calif.

[21] Appl. No.: 245,207

[22] Filed: May 17, 1994

[51] Int. Cl.$^6$ .................................................. G06F 17/50
[52] U.S. Cl. ........................ 364/491; 364/490; 364/488
[58] Field of Search .................................. 364/488, 489, 364/490, 491, 578, 419.19

[56] References Cited

U.S. PATENT DOCUMENTS

| | | | |
|---|---|---|---|
| 4,896,272 | 1/1990 | Kurosawa | 364/491 |
| 5,239,465 | 8/1993 | Hattori et al. | 364/419.19 |
| 5,299,137 | 3/1994 | Kingsley | 364/489 |
| 5,345,393 | 9/1994 | Ueda | 364/489 |
| 5,396,435 | 3/1995 | Ginetti | 364/489 |
| 5,426,591 | 6/1995 | Ginetti et al. | 364/489 |
| 5,452,227 | 9/1995 | Kelsey et al. | 364/489 |

OTHER PUBLICATIONS

"Large Memory Embedded ASIC's", by T. Iizuka et al., IEEE, Computer Design–ICCD '88, 1988 International Conference, pp. 292–295.

"Embedded Memory: A Key to High Performance System VLSIs", by Tetsuya Iizuka, IEEE, VLSI Circuits, 1990 Symposium, Feb. 1990, pp. 1–4.

"A Sub–Micron CMOS Embedded SRAM Compiler", by J. Tou, J. Duh, P. Gee and R. Eesley, IEEE, Custom Integrated Circuits Conference, 1991, pp. 22.3.1–22.3.4.

"Delay Testing and Failure Analysis of ECL Logic with Embedded Memories", by K. Welch et al., IEEE, VLSI Test Symposium, 1991, pp. 254–259.

"A Cell–Based Datapath Synthesizer for ASICs", by A. Ginetti et al., IEEE, ASIC Conference and Exhibit, 1993, pp. 416–419.

"Time Molding of Datapath Layout for Synthesis", by B. Sharma et al., IEEE, Verilog HDL, 1994 Conference, pp. 80–84.

Keutzer, Kurt, "DAGON: Technology Binding and Local Optimization by DAG Matching," 24th ACM/IEEE Design Automation Conference, ACM 1987, pp. 341–359.

Mossaddeq Mahmood et al., "A Datapath Synthesizer for High–Performance ASICs," IEEE 1992 Custom Integrated Circuits Conference, pp. 5.1.1–5.1.4.

Nikil D. Dutt et al. "Bridging High–Level Synthesis to RTL Technology Libraries," 28th ACM/IEEE Automation Conference, ACM 1991, pp. 526–529.

(List continued on next page.)

Primary Examiner—Kevin J. Teska
Assistant Examiner—Russell W. Frejd
Attorney, Agent, or Firm—Hickman Beyer & Weaver

[57] ABSTRACT

A set of circuit specifications including an internal memory structure is developed and then described in a hardware description language that is entered into a computer system. The circuit description is then synthesized on the computer to form a netlist to specify the circuit. From this netlist, an integrated circuit is produced on a semiconductor die, which is then packaged for use. A method for synthesizing a netlist from a hardware description including an internal memory structure includes converting the hardware description into an internal signal list, which contains an indication of the presence of an internal memory structure in the described circuit. For each memory structure indicated, synthesis is performed using a memory cell library, and compatibility between the hardware description for the circuit and the internal memory structure specified is determined. When compatibility is found, the internal memory structure is instantiated into the netlist for the circuit. A central processing unit (CPU) is connected to a keyboard used to input a hardware description of a circuit. Further included is a hardware description processor implemented on the CPU that creates mask generation data for use with a mask generator to form an integrated circuit. An internal memory structure as described in the hardware description of the circuit is thereby included in the circuit.

43 Claims, 15 Drawing Sheets

OTHER PUBLICATIONS

Taewhan Kim et al., "Utilization of Multiport Memories in Data Path Synthesis," 30th ACM/IEEE Design Automation Conference, ACM 1993, pp. 298–302.

Kramer et al, "Assignment of Global Memory Elements for Multi–Process VHDL Specification," IEEE 1992, pp. 496–501.

Christos Papachristou et al., "An Approach for Redesigning in Data Path Synthesis," 30th ACM/IEEE Design Automation Conference, ACM 1993, pp. 419–423.

Douglas M. Grant et al., "Memory, Control and Communications Synthesis for Scheduled Algorimths," 27th ACM/IEEE Design Automation Conference, IEEE 1990, pp. 162–167.

R. Brayton et al., "Multiple–Level Logic Optimization System" IEEE 1986, pp. 356–359.

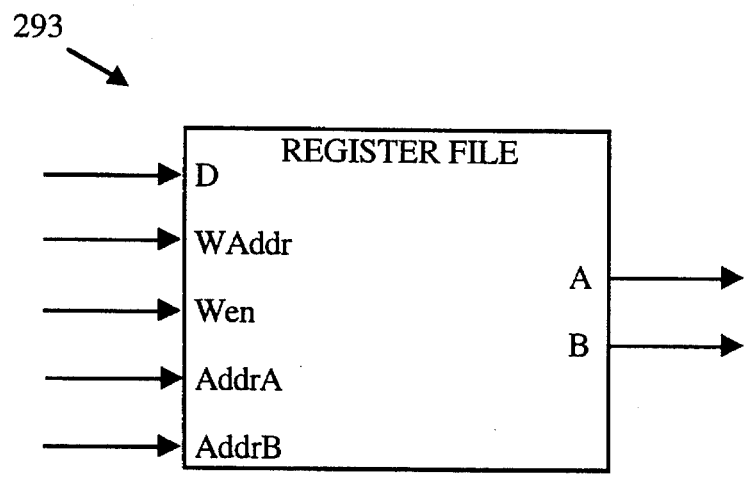
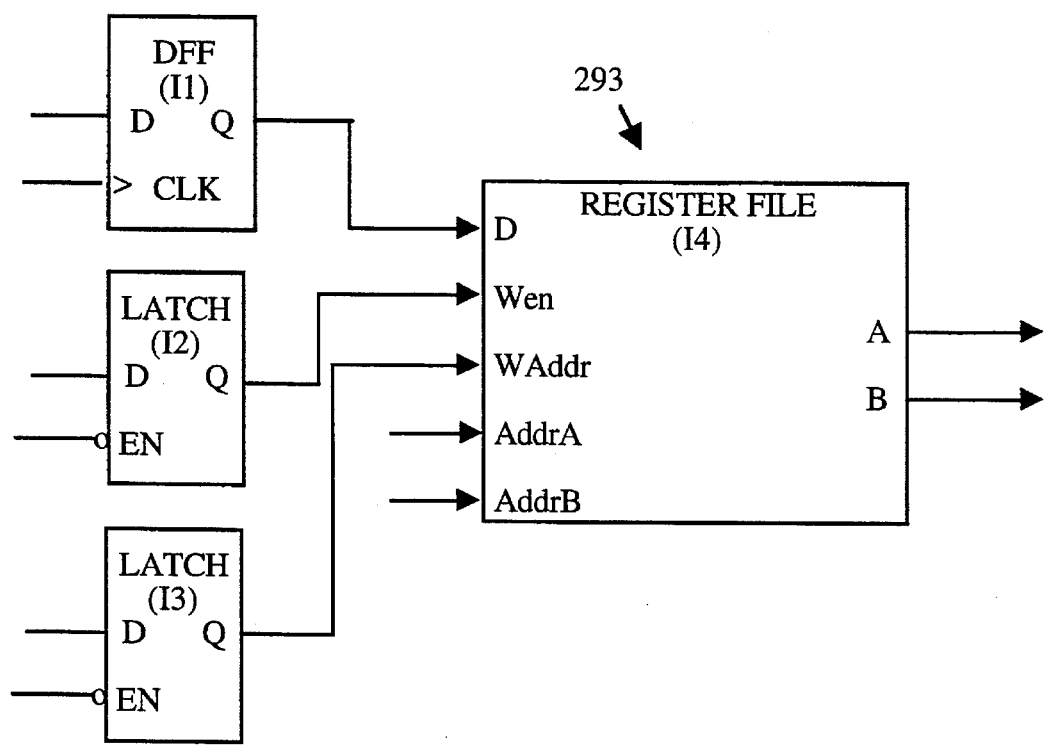
FIG. 10b

METHOD AND APPARATUS FOR FORMING AN INTEGRATED CIRCUIT INCLUDING A MEMORY STRUCTURE

BACKGROUND OF THE INVENTION

The present invention relates generally to synthesis of integrated circuits and more particularly to synthesis of memory in integrated circuits.

The development of the integrated circuit (IC) chip has been integral to the improvement and advancement of many industries. As the size of these ICs has reduced, their incorporation into a variety of applications has increased. While in some situations, a designer is able to use standard ICs for a desired function, in other situations, standard chips are unable to meet the precise needs of a designer. In such situations, designers often turn to an application specific integrated circuit (ASIC).

ASICs allow a designer to design an optimal circuit with desired customer specifications and functionality without conforming to the feature and performance limits of a standard chip. Typically, ASIC production begins with a set of circuit specifications. This design is then written in a hardware description language (HDL), such as VHDL, the IEEE standard, which is well known to those skilled in the art. The description is then "synthesized", i.e., a computer program uses the set of circuit specifications to design the circuitry of the IC, behavior of the circuit is verified, and a circuit layout is created. From the layout, a mask is formed and used for the IC chip production.

Techniques for the synthesis portion of ASIC creation are standardly aimed at producing gate-level netlists for gate arrays or standard cell implementations. While these methods for circuit design are well known, they traditionally fail to address the synthesis of memory components in ASIC designs.

For memory structures of an ASIC, conventionally either random logic synthesis or structural instantiation is used. However, with random logic synthesis, which generates a design of flip/flops, latches, and control logic to function as memory, designers are unable to take advantage of special architectures for memories that may give better results. On the other hand, structural instantiation requires that the designer manually create and complete the memory design including the memory control logic, so that they are unable to take full advantage of the synthesis tools. Therefore, neither of these techniques provides the designer with sufficient flexibility.

Approaches to providing separate memory synthesis have mainly focused on memory unit allocation based on analysis of variable or signal use in an HDL circuit description. Most of these approaches, however, have not examined characterizing memory elements and mapping generic memory units into technology-specific units. Existing tools that map generic components into technology-specific ones have focused on logic-level gates, such as NAND gates and NOR gates, simple sequential components, such as flip-flops and latches, or combinational datapath elements, such as ALUs, shifters, and adders. They have failed to address the mapping for complex memory structures, such as register files, RAMs, and ROMs. Therefore, what is needed is a method for synthesis of memory in ASICs that enhances ASIC design approaches by creating smaller circuits and providing designers with greater flexibility.

SUMMARY OF THE INVENTION

In accordance with the purpose of the present invention, a method and apparatus for making an integrated circuit having internal memory structures are described. More particularly, a method and apparatus are disclosed for the synthesis of embedded memory in an integrated circuit.

In a method for making an integrated circuit having an internal memory structure, a set of circuit specifications including the internal memory structure is first developed, then described in a hardware description language, and input into a computer system. The circuit description is then synthesized on the computer to form a netlist to specify the circuit. From this netlist, an integrated circuit is produced on a semiconductor die, which is packaged to form the final product.

Further included is a method for synthesizing a netlist from a hardware description including an internal memory structure. The method comprises first converting the hardware description into an internal data structure that includes a list of signals found in the HDL, which contains an indication of the presence of an internal memory structure in the described circuit. For each memory structure indicated, synthesis is performed using a memory cell library, and compatibility between the hardware description for the circuit and the internal memory structure specified is determined. When compatibility is found, the internal memory structure is instantiated into the netlist for the circuit.

An apparatus for the present invention includes a central processing unit (CPU) connected to an input device, such as a keyboard, used to input the hardware description of the circuit to the CPU. Further included is a hardware description processor that creates mask generation data for use with a mask generator. The masks are used in the manufacture of integrated circuits, which include an internal memory structure as specified by the hardware description.

With the present invention, circuit designers are able to more efficiently design circuits by incorporating efficient memory structures into the circuit. This provides greater flexibility for IC production. Further, by eliminating the need to incorporate random logic to function as memory, circuit size is reduced. Additionally, by synthesizing a memory structure into a circuit and eliminating the use of structural instantiation of a specific memory component, the designer can incorporate a memory structure without completing all logic controls for the design. Thus, a generic description of a memory structure can be used and effectively mapped into a technology-specific memory structure, which reduces the time required to design an ASIC.

These and other advantages of the present invention will become apparent upon reading the following detailed descriptions and studying the various figures of the drawings.

BRIEF DESCRIPTION OF THE DRAWINGS

FIG. 1b illustrates an example of a mask for forming the circuit layout of FIG. 1a;

FIG. 10b illustrates an example of an asynchronous register file and a circuit for synchronizing the register file;

DETAILED DESCRIPTION OF THE PREFERRED EMBODIMENTS

Figure 1:
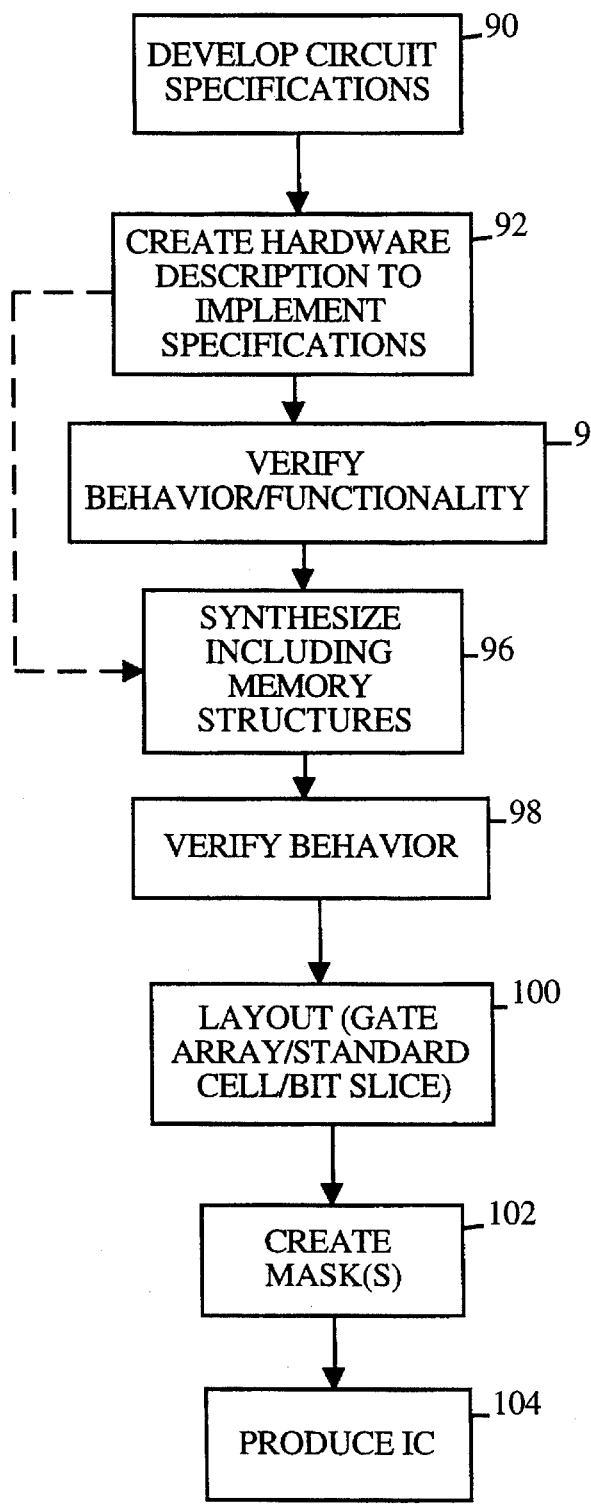
FIG. 1 is a method for the production of an ASIC with an embedded memory structure in accordance with the present invention.

FIG. 1 illustrates a method in accordance with the present invention for producing an integrated circuit ("IC") with internal memory structures. The method begins in step 90 with the development of the circuit specifications to implement a desired design. For example, required inputs and outputs are specified, as are speed and other performance parameters. After creating the circuit specifications, the process continues with step 92 and the production of a description of the circuit in a hardware description language (HDL) such as IEEE Standard VHDL (VHSIC Hardware Description Language), or Verilog, a standard from Open Verilog International. Once the circuit is specified, the functionality may then be verified in step 94 by logic simulators. Alternatively, step 94 can be omitted, as indicated by the broken arrrow. The process then proceeds with step 96 and the synthesis of the specified circuit. Once the synthesis is completed, the resulting netlist for the circuit is verified for proper behavior and functionality in step 98. This is suitably performed by a logic simulator. With the circuit functionality verified, the process continues with layout of the circuit in step 100. This includes the layout of the gate array cells, standard cells, and bit-sliced layout modules for the circuit based on the layout netlist. Once the circuit layout is completed, a mask of the layout is created in step 102. This mask is then used to produce an integrated circuit (IC) chip in step 104. Steps 90–94 and 98–104 are well known to those skilled in the art. Step 96 of the present invention will be described in greater detail with reference to FIGS. 3–14.

Figure 1A:
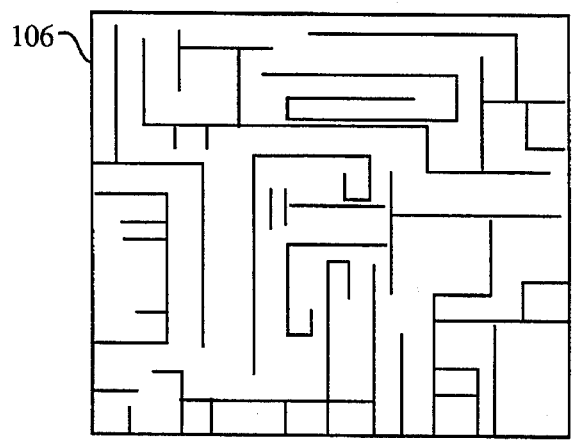
FIG. 1a presents an example of a circuit layout.
Figure 1B:
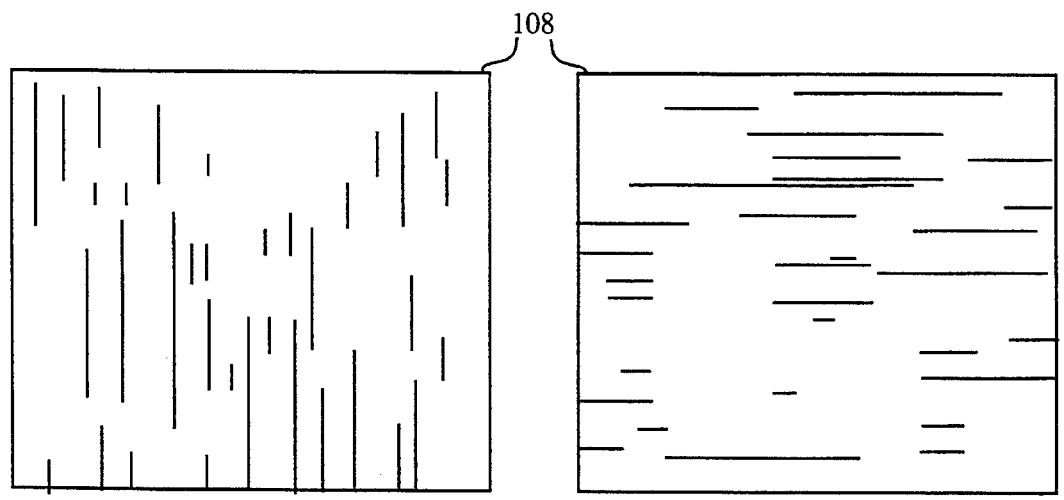
Figure 1C:
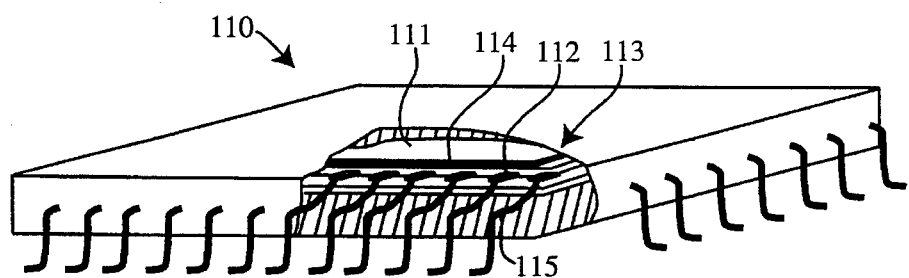
FIG. 1c is an illustration of a packaged IC of the present invention.

FIGS. 1a–1c present a non-operational example of a circuit layout 106, a possible set of masks 108 used to create the circuit, and an IC chip produced 110. The layout 106 illustrates in a simple line format a series of element interconnections resulting from a synthesized netlist for a circuit, as is well known to those skilled in the art. From this layout 106, masks 108 can be formed to transfer the pattern to a semiconductor die, the processes of which are standard in the art. The patterned semiconductor die 111 is enclosed in a package 110, again by standard processes. Input/output (I/O) connections from die 111 are formed from bonding pads 112 of a lead frame 113, having a die attach pad 114, via bonding fingers 115, which are suitably formed by wire connectors. Alternatively, the die 111 can be packaged in a ceramic package or other type of package, as is well known to those skilled in the art.

Figure 2:
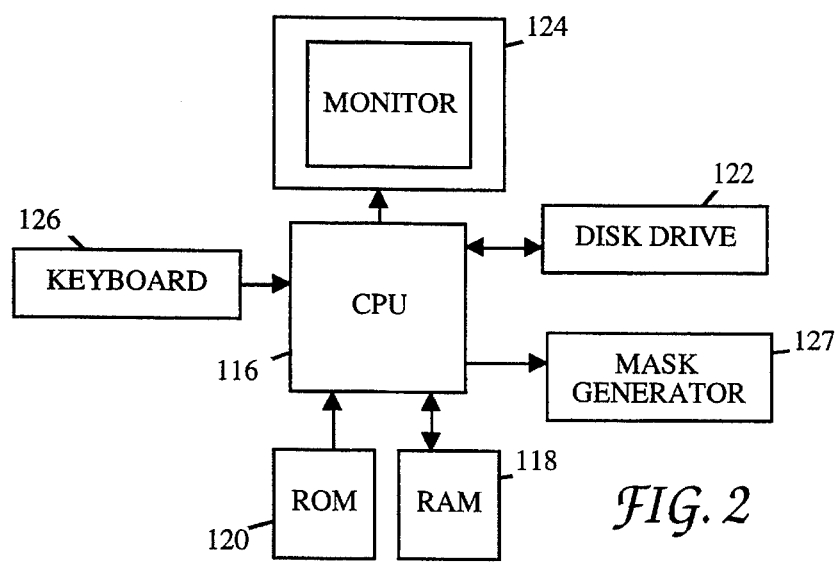
FIG. 2 is a block diagram of a computer system.

FIG. 2 illustrates in block diagram form a system for implementing the method described with reference to FIG. 1. This system includes a central processing unit (CPU) 116, random access memory (RAM) 118, read only memory (ROM) 120, a disk drive 122, a monitor 124, and a keyboard 126. Keyboard 126 is a preferred user input device for entering HDL, but other equivalent devices and methods are well known to those skilled in the art. An example of a computer system suitable for use with the present invention is an HP 700 Series workstation, available from Hewlett-Packard, Cupertino, Calif. or a SUN SPARC workstation available from Sun Microsystems, Inc., of Mountain View, Calif. Of course, other computer systems that are capable of supporting integrated circuit synthesis are also suitable. A mask generator 127 is also included as either a part of the computer system or as a separate system. An example of a suitable mask generator in machine form is MEBES available from MEBES, Inc. An example of a mask generator in software form is DRACULA available from Cadence Design Systems, Inc., of Santa Clara, Calif. This mask generator 127 capably forms masks, such as masks 108 of FIG. 1b, from mask generation data, which are then used to make the integrated circuit. This mask generation data is suitably obtained from the hardware description of the circuit as input using the user input device, such as keyboard 126, and processed by a hardware description processor implemented on the CPU 116.

Figure 3:
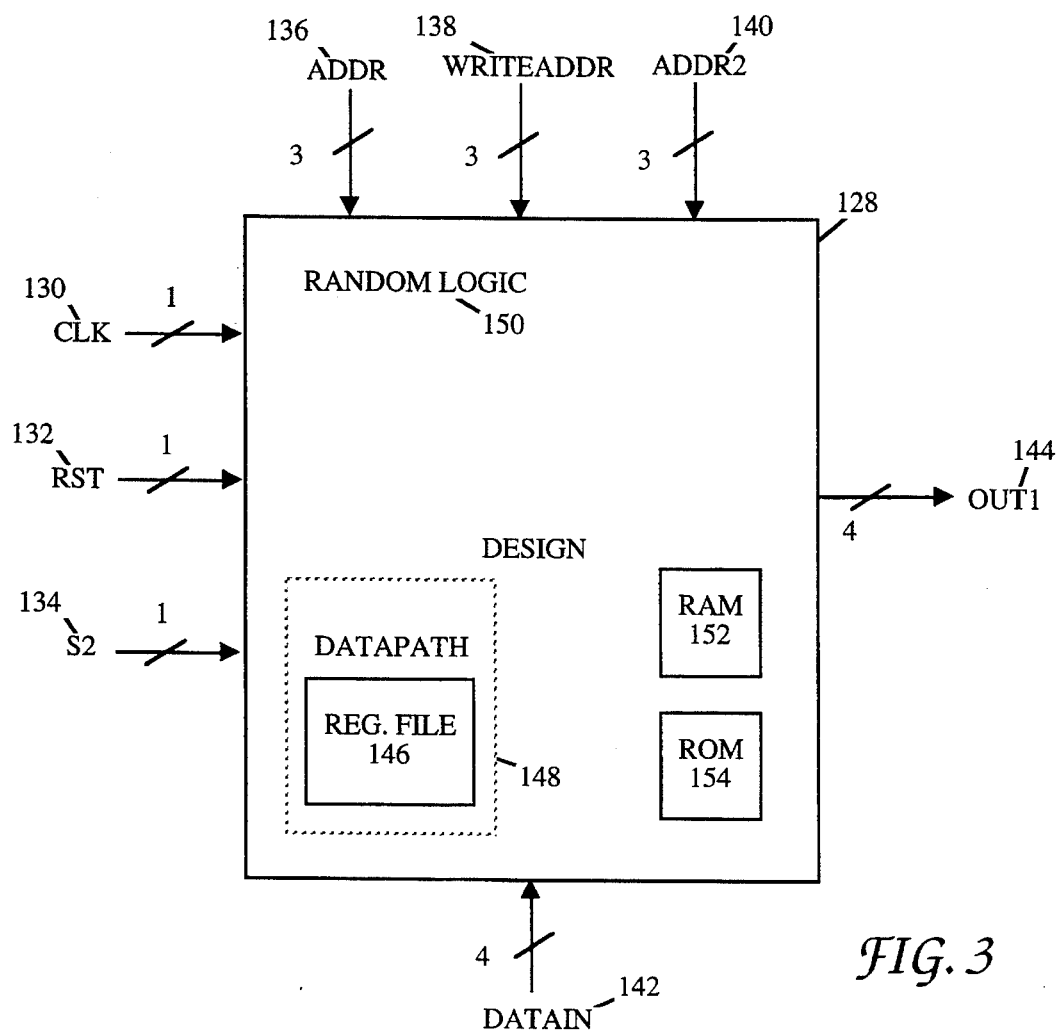
FIG. 3 is an example of a circuit block diagram illustrating the interrelation of various signals in a design.

An interrelation between input, output, and control signals to the overall design of a hypothetical circuit is illustrated in FIG. 3. As shown, block 128 represents a circuit design. For this design, a number of input signals are specified. A clock signal 130 is shown as a one bit input signal "clk" and identifies the circuit as a synchronous circuit, i.e., operations are dependent on a clock edge. Two one bit input control signals are represented by RST (restart) line 132 and S2 (signal-2) line 134. Additionally, three three-bit address lines are shown as ADDR (address) input 136, WRITEADDR (write address) input 138, and ADDR2 (address 2) line 140. These lines contain the information to designate the address to be written to or read from in a memory cell within the hypothetical design. Line 142 DATAIN, represents four bits of data for input, while OUT1 line 144 represents four bits of output data.

After the specified design has been synthesized, various components of the design are manifest. For example, when a register file 146 is specified as a memory cell or internal memory structure in the behavioral description for a circuit, it is contained in the datapath portion 148 produced by the datapath synthesis of the circuit. In this discussion, a register file or register file cell is a small, fast memory similar to SRAM (static random access memory). This type of memory cell has space of up to 4000 words and typically has 128 words, each containing 8–80 bits. It is also very local and closest to data manipulating elements, such as adders, ALUs (arithmetic logic units), or comparators, thus resulting in its inclusion in the datapath portion of the circuit. The random logic 150 produced by the random logic synthesis is maintained outside of the datapath 148. Also, when random access memory (RAM) 152 or read only memory (ROM) 154 are specified as memory cell components in HDL and are then synthesized, they are maintained as separate blocks within the synthesized design, since the layouts for these elements are generated by special memory compilers that can generate more dense layouts. Although the present invention is described in terms of a register file cell as the specified memory cell, other types of memory are to be considered equivalent in this invention, and the processes described are suitable in a similar manner to RAM and ROM components as well, as will be appreciated by those skilled in the art.

An example of a VHDL description of a synchronous circuit that will be used as a reference circuit with the remaining figures is given below in Table 1. Such a description corresponds to step 92 of FIG. 1.

TABLE 1

```
1.  library compass_lib, ieee ;
2.  use ieee.std_logic_1164.all ;
3.  use compass_lib.compass.all ;
4.  entity rfpt2 is
5.  (dataIn1,dataIn2: in bit_vector(0 to 3) ;
6.       clk, s1, s2: in bit;
7.       addr1, addr2, writeAddr: in integer range 0 to 7 ;
8.       out1: out bit_vector(0 to 3)) ;
9.  end rfpt2;
10. architecture rfpt2_A of rfpt2 is
11. begin
12. process(clk)
13. type regFileType is array (0 to 7) of bit_vector(0 to 3) ;
14. variable regfile: regFileType ;
15. -compass dp_cell_net regFile DPRGF010H
16. begin
17.     if clk'event and clk='1' then
18.        if s1='1' or s2='0' then
19.        out1 <= regFile(addr1) + regFile(addr2) ;
20.        else
21.        out1 <= regFile(addr1+addr2) ;
22.        end if;
23.        if s2= '1' then
24.        regFile(writeAddr) := dataIn1;
25.        else
26.          if s1='0' then
27.          regFile(writeAddr) := dataIn2 ;
28.          end if;
29.        end if;
30.     end if;
31. end process;
32. end rfpt2_A;
```

In the first portion of the description, i.e., lines 1–3, a set of libraries containing functions used in the VHDL description are declared. For example, the definition of the plus ("+") is defined in the library called "compass_lib". In the second portion of the table (lines 4–9), the inputs and outputs to the design entitled "rfpt2" are declared. In this example, the ports include two four bit data input ports (dataIn1, dataIn2), a one bit clock input signal (clk), and two one bit input control signals (s1, s2). Three three-bit input address ports are specified as addr1, addr2, and writeAddr. Lastly, a four-bit output port is specified as out1. The architecture of the circuit is then identified in the last portion (lines 10–32) of the description.

The architecture description begins with the declaration of a VHDL process on line 12 and includes all lines through "end process;" on line 31. The declaration of the process on line 12 indicates that the process will be sensitive to the signal "clk". That is, the contents of the process must be reevaluated anytime there is a change in the value of the signal "clk". A variable regFile being of type regFileType is then listed in line 14 as an array of eight words, four bits each, i.e., a two-dimensional (2D) array of data, which presents indicia of a memory structure. Line 15 specifies that the memory should be implemented as a datapath register file and should use datapath library cell DPRGF010H which is more fully described in VLSI Technology, Inc. 0.8 Micron CMOS VCC4DP3 Datapath Library-Rev. A, pages 259–261. Line 15 is a comment in VHDL and thus does not have any effect on the behavior of the description. However, when running the synthesis program, the designer can input a list of component and datapath libraries which are capable of implementing the circuit. The memory cell used in line 15 must be available from one of these libraries. An example of a suitable library which includes register file DPRGF010H is the aforementioned VCC4DP3 library, and its successor, the VCC4DP4 library. Of course, for other libraries, other cells would be contained and appropriately identified in this portion of the description. Also, the format for specifying the cell to be used as shown is merely meant to serve as an example in accordance with the library chosen.

The next portion of the description (lines 17–27) contains the specifications for the behavior of the design. Part of this behavior includes writing data to and reading data from the variable regFile, which is implemented as a register file. The behavior in line 17 identifies that a synchronous circuit is desired and will be controlled by a rising edge on signal "clk", i.e., when "clk" makes a transition from low to high or '0' to '1'. Further control is specified in lines 18–19 such that when input signal s1 is '1' or signal s2 is '0', then the data held at the register file at the address specified by the input port addr1 is added to the data held in the register file at the address specified by the input port addr2, and the sum is output at output port out1. Otherwise, the data held at the address indicated by the sum of the addresses input at the addr1 port and the addr2 port is output at output port out1. For the input, i.e., the writing, of data to the register file, the data at input port dataIn1 is written to the address indicated by the writeAddr port when the input signal s2 is a '1'. Otherwise, when s1 is '0', the data held at the input port dataIn2 is stored at the address indicated by the word in the writeAddr port. This completes the circuit specification for the design "rfpt2" which employs a memory structure that is to be implemented as a register file.

The example is meant as a demonstration of describing a circuit behavior using a two-dimensional array that when synthesized will use a memory structure, such as a register file. In this example, the behavioral description is synchronous, however, the register file cell DPRGF010H that is to be used to implement the storage for variable regFile is asynchronous. Thus, during synthesis, additional external control logic will have to be added to synchronize the circuit. This is described more fully with reference to FIG. 10b. Other descriptions are possible based on specific design needs. As an example of one such alteration, an asynchronous circuit specification is presented below in Table 2.

TABLE 2

```
1. library compass_lib, ieee ;
2. use ieee.std logic 1164.all ;
3. use compass lib.compass.all ;
4. entity rfpt3 is
5. port (dataIn1,dataIn2: in bit_vector(0 to 3) ;
6.       clk, s1, s2: in bit;
7.       addr1, addr2, writeAddr: in integer range 0 to 7 ;
```

TABLE 2-continued

```
8.      out1: out bit_vector(0 to 3)) ;
9.  end rfpt3;
10. architecture rfpt3_A of rfpt3 is
11. begin
12.   process(s1, s2, addr1, addr2, writeAddr, dataIn1, dataIn2)
13.   type regFileType is array (0 to 7) of bit_Vector(0 to 3) ;
14.   variable regFile: regFileType ;
15.   -compass dp_cell_net regFile DPRGF010H
16.   begin
17.     if s1='1' or s2='0' then
18.       out1 <= regFile(addr1) + regFile(addr2) ;
19.     else
20.       out1<= regFile(addr1+addr2) ;
21.     end if;
22.     if s2= '1' then
23.       regFile(writeAddr) := dataIn1;
24.     else
25.     if s1='0' then
26.       regFile(writeAddr) := dataIn2 ;
27.     end if;
28.    end if;
29.  end process;
30. end rfpt3_A;
```

As listed, the differences between Table 1 and Table 2 for the circuit specification occur in the process line (line 12) and in the control of the output specification (lines 18–28). The example of Table 2 does not use a clock, and as shown in line 12, the output signals will be reevaluated anytime that one of the listed signals in line 12 changes. Also, instead of making the output dependent on the clock signal as well as signals s1, s2, addr1, and addr2, the output for this asynchronous circuit merely depends on s1, s2, addr1, and addr2.

Figure 4:
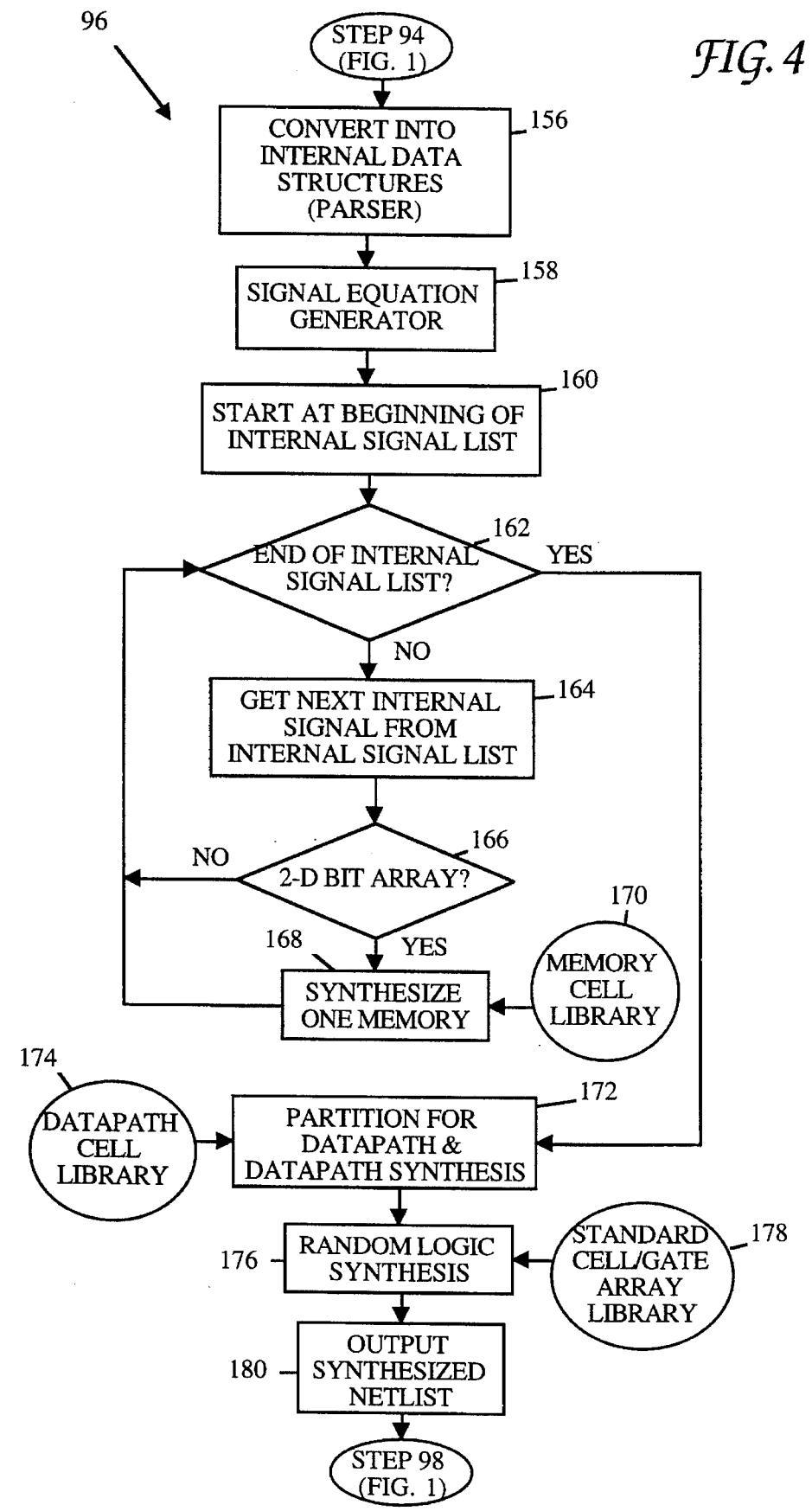
FIG. 4 is a flow chart illustrating the "synthesize" step 96 of FIG. 1 in greater detail.

Following the behavioral description of a circuit, such as that presented in Table 1, a next step is the synthesis of the circuit (step 96 of FIG. 1), the overall steps of which are presented in FIG. 4. Alternatively, behavior and functionality of the circuit can be analyzed in step 94, as is well known to those skilled in the art. As shown, the step of synthesis begins with the conversion of the circuit specifications into internal data structures by a parser in step 156. This step produces a signal list and forms a data/control flowgraph from the hardware description and is described in greater detail with reference to FIG. 5. Following the conversion step, the process continues with step 158 and solving the internal data structure to generate an initial set of equations that define the value of each signal in the HDL description. An example of the signal generation is provided subsequently with reference to FIG. 5a. The next step 160 initiates the synthesis at the beginning of the internal signal list. In step 162, a check is made to determine if the end of the internal signal list has been reached. If not, the process continues with step 164 and the reception of an internal signal from the internal signal list as generated from step 158. Step 166 then determines if this signal is a "2D array signal" that should be implemented as a datapath register file cell (e.g., as specified in the VHDL description of Table 1 in line 15). If so, the memory described by the HDL behavioral description will be synthesized in step 168, the process for which is presented in more detail in FIG. 7. The memory cell library 170 is used in this synthesis step, and as mentioned previously, the VCC4DP4 datapath cell library from VLSI Technology, Inc., is suitable to implement the memory requirements found in the hardware description of Table 1. An example of the design for a datapath register-file cell from such a library (170) is shown in FIG. 6.

Following completion of the synthesis for this cell or if the internal signal is not a 2-D array, the process returns to step 162. Once the end of the internal signal list is reached, step 172 continues the process with the partitioning of the signal equations for the datapath and the synthesizing of the datapath using the datapath cell library 174, which produces a datapath netlist. An example of datapath synthesis is presented in and discussed with reference to FIG. 12. Next, in step 176, the random logic for the circuit is synthesized using a standard cell or gate array library 178, which produces a random logic netlist. The results of this are presented in FIG. 13. Following completion of the synthesis steps, the synthesized netlist for the circuit is output in step 180 before the process returns to step 98 of FIG. 1 for verification of the synthesized circuit.

Figure 5:
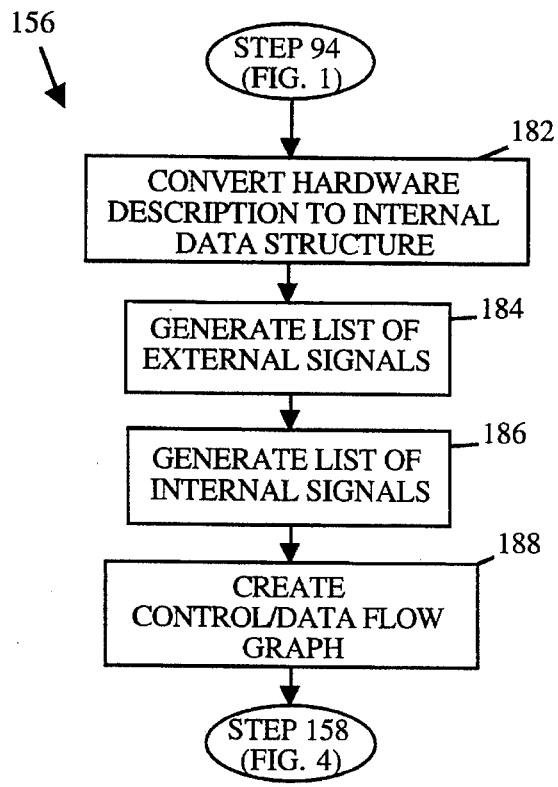
FIG. 5 is a flow chart illustrating the "convert into internal data structure" step 156 of FIG. 4 in greater detail.
Figure 6:
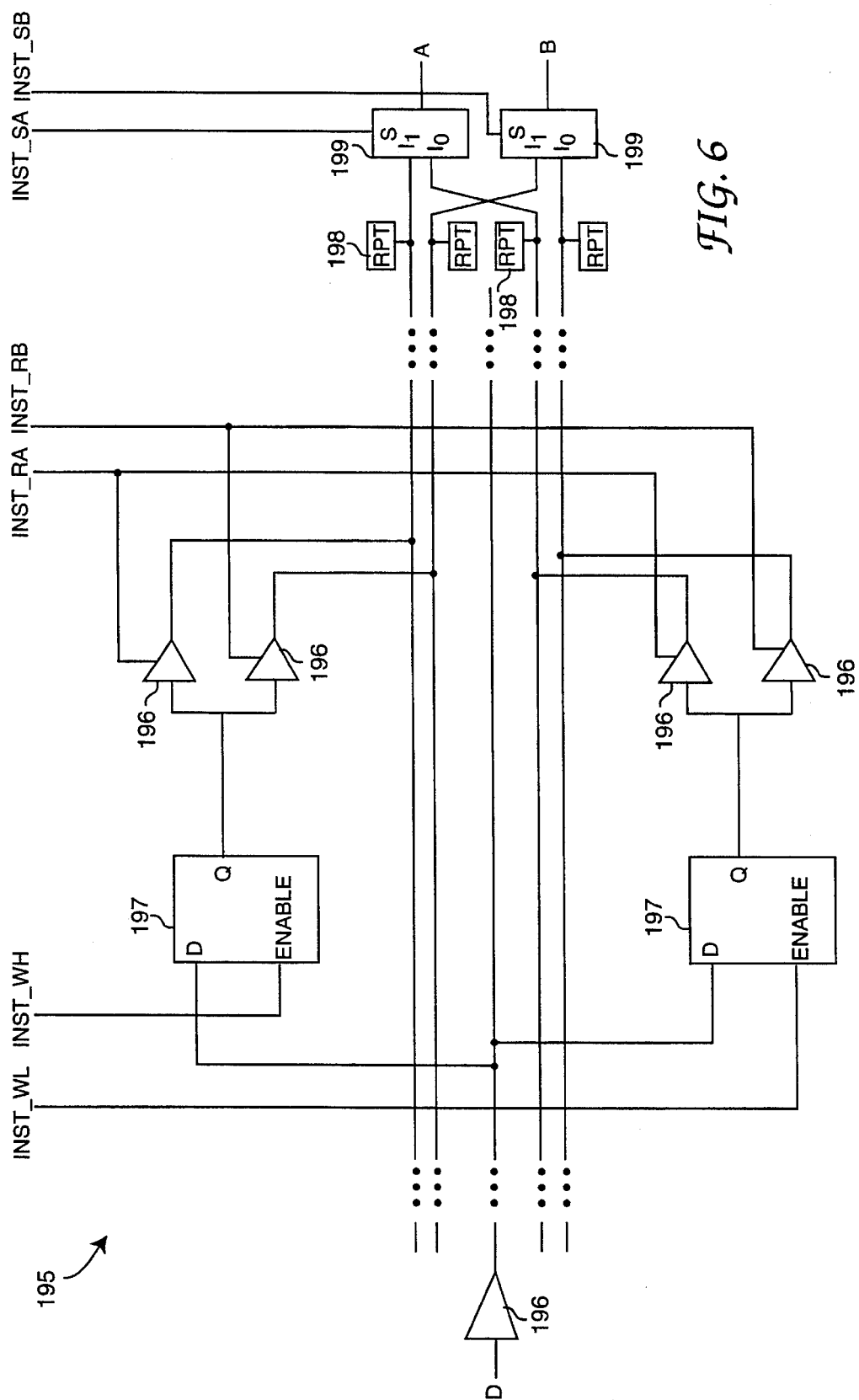
FIG. 6 is an example of a register file and its components.

The process for conversion of the hardware description in the synthesis of the circuit (step 156 of FIG. 4) is presented in FIG. 5. The process begins in step 182 with the conversion of the hardware description specification into the internal data structure. A list of external signals, i.e., those signals shown as inputs or outputs to a "black-box" of the design (visible to the outside world), is then created in step 184 while a list of internal signals, i.e., those signals internal to the design which cannot be accessed outside of the design, is created in step 186. A control/data flow graph is then created showing the order of operations performed on signals in these lists in step 188. The process then returns to step 158 (FIG. 4) for the generation of the signal equations for signals in these lists.

Figure 5A:
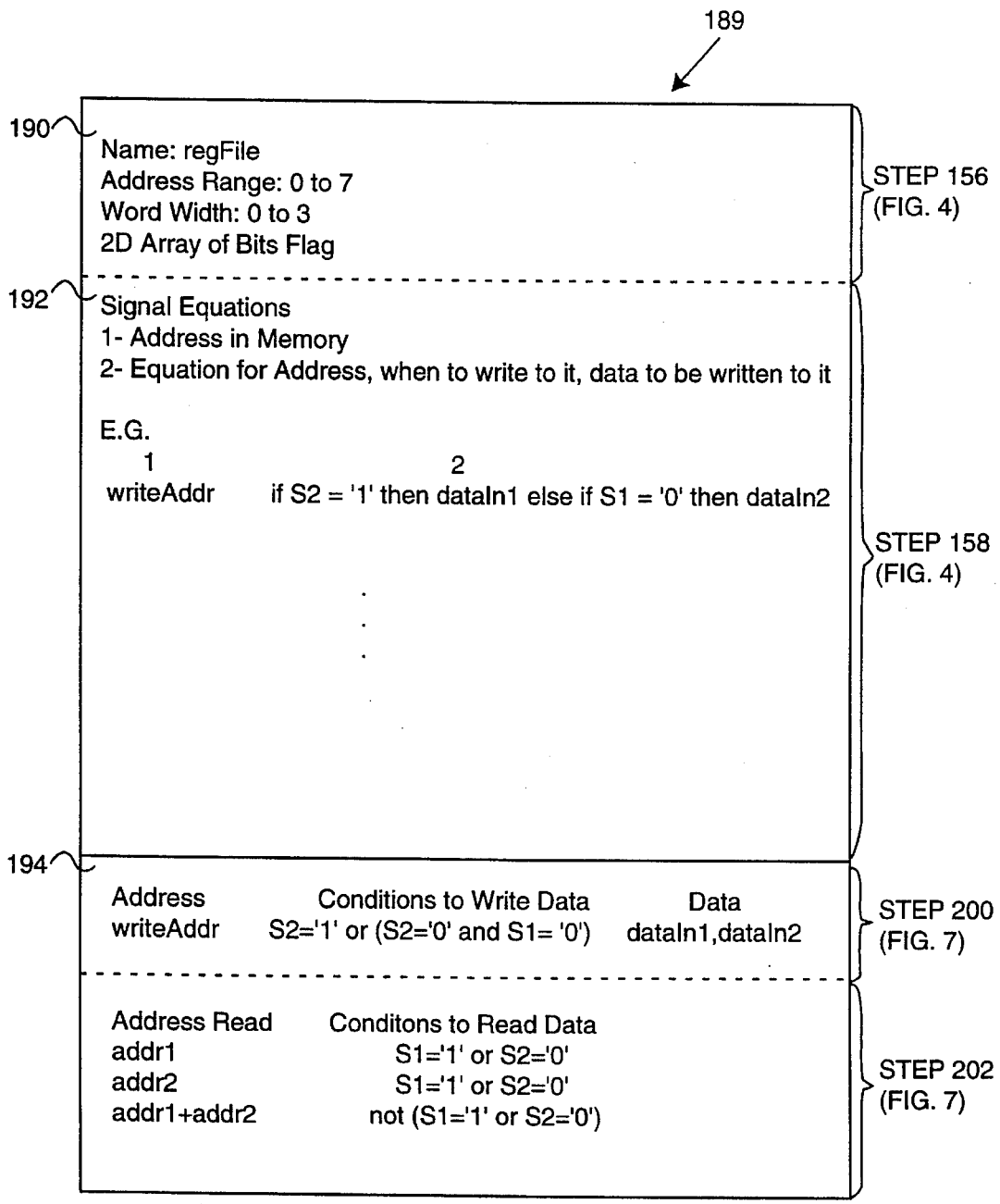
FIG. 5a is a diagram showing a register file data structure.

The results of the conversion step 156 of FIG. 4 from the process of FIG. 5 are illustrated in block 190 of a data structure 189 for a register file signal called regFile as shown in FIG. 5a. In this conversion step, the parser converts the HDL description into a set of data structures, so that using the example of Table 1, the variable regFile is identified and a data structure is created showing that it has an address range of words from 0 to 7, a word width of 0 to 3, and a 2D array of bits flag. The data structure is further used for the signal generation step 158 of FIG. 4 and is represented in block 192. As shown, each address of the 2D-array signal that is written to is stored along with an equation describing the data and conditions for writing to each address. By way of example using the description from Table 1, the signal writeAddr is identified by the signal equation generator as an address of the signal regFile that is written to and is assigned an equation specifying that when the signal s2 is '1', the data at dataIn1 will be placed at that write address. Otherwise, if s1 is '0', the data at dataIn2 will be written to that write address. Similarly, equations for the other signals would be generated appropriately and placed in the list by the signal equation generator step. The synthesis of the memory structure (step 168 of FIG. 4) for signal regFile results in the inclusion of block 194 in the data structure with the conditions for reading from or writing to the memory cell in accordance with Table 1, and is given in greater detail with reference to the process of FIG. 7.

An example of a register file cell structure from a memory cell library (170) is illustrated in FIG. 6. In keeping with the example of Table 1, the register file structure shown represents a DPRGF010H register file cell 195. As shown, this register file has several logic components 196, flip-flops 197, repeaters 198, and multiplexors 199 that are used to control the transfer of data to or from the cell. VLSI Technology, Inc. –0.8 Micron CMOS VCC4DP3 Datapath Library-Rev. A describes in fuller detail the particular configuration of this cell along with the function and operation of the cell components. Of course, this is just one example of one cell from one library, which is meant to be illustrative, so that variations to this particular cell are numerous and are capable of being incorporated in accordance with the present invention.

Figure 7:
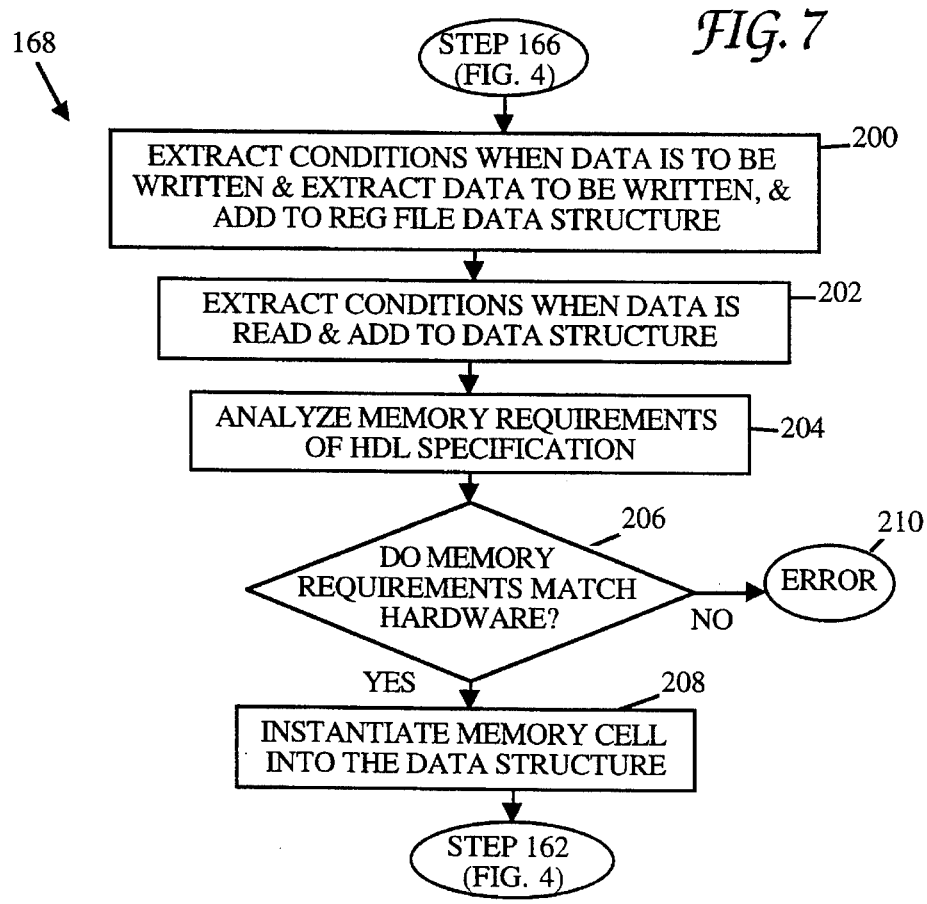
FIG. 7 is a flow chart showing the "synthesize one memory" step of FIG. 4 in greater detail.

FIG. 7 presents the steps for the synthesis of one memory cell (step 168 of FIG. 4), such as a register file cell. The first step 200 is to extract the conditions for when the data is to be written and extract the data that is to be written, and add both to the register file data structure. The conditions are extracted from the write equations generated in step 158 (FIG. 4) and listed in block 192 of FIG. 5a. The conditions for reading data are then extracted from the list of all equations generated in step 158 of FIG. 4 and added to the data structure in step 202. As mentioned previously, block 194 of FIG. 5a shows the inclusion of these conditions for reading and writing in accordance with the example of Table 1. The memory requirements as specified in the HDL description are then analyzed in step 204, which is detailed in FIG. 8. These requirements include the number of read/write ports needed to implement the circuit specified in HDL as well as the synchronicity of the memory cell. Step 206 then determines whether the requirements for the memory match the hardware specified, i.e., whether the behavioral description can be performed by the specified memory cell. If so, the memory cell is instantiated into the data structure in step 208, before the process returns to step 162 of FIG. 4. Instantiation of a memory cell involves the mapping of the described behavior to the hardware component, generating all associated control logic, and assigning connections to pins of the hardware component, which is given in fuller detail with reference to FIG. 9. After finishing this step, the process returns to step 162 of FIG. 4. If the memory cell and the hardware requirements do not match as determined in step 206, an error is indicated in step 210.

Figure 8:
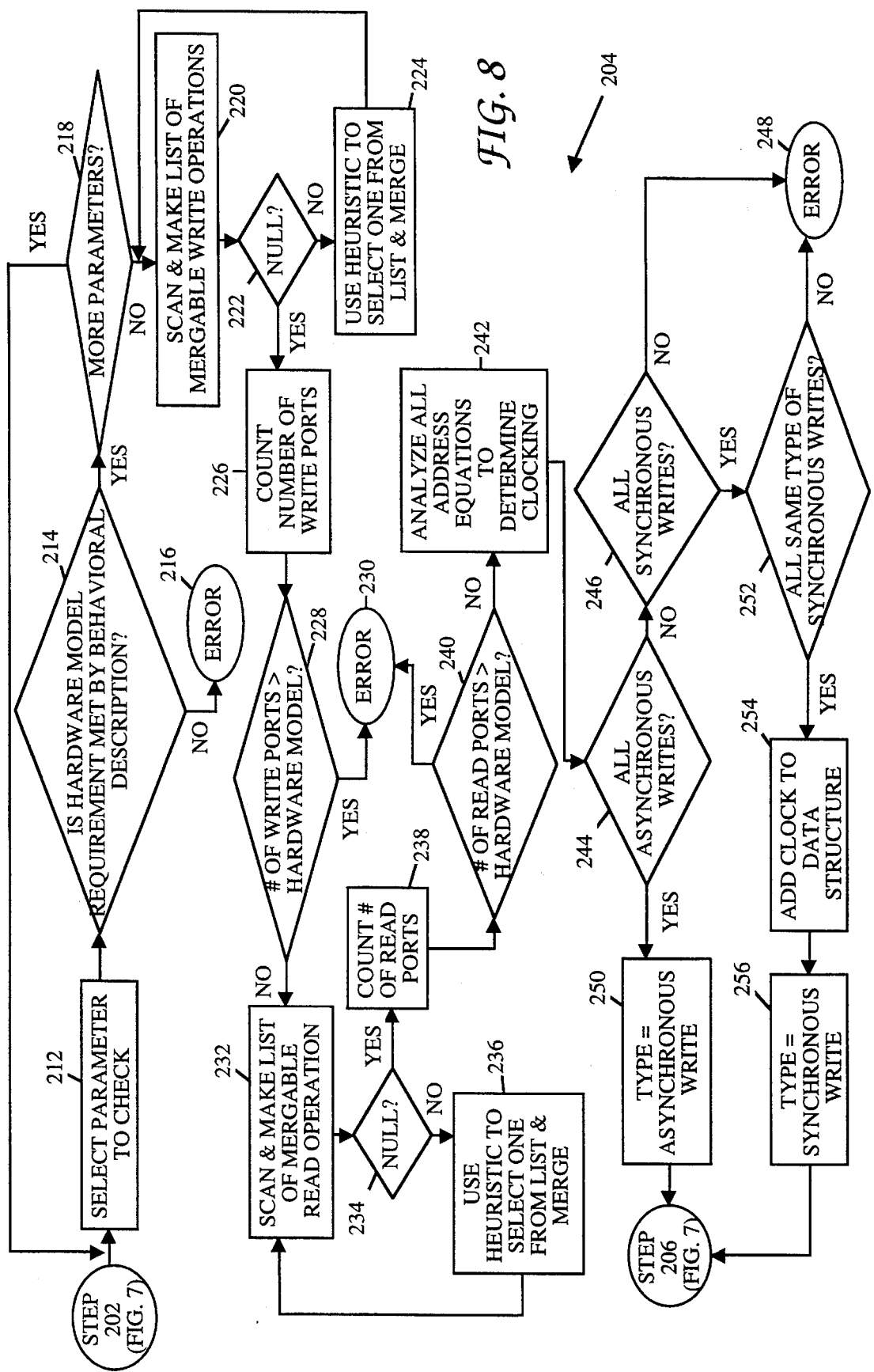
FIG. 8 is a flow chart illustrating the "analyze memory requirements" step 204 of FIG. 7 in greater detail.

Once the conditions for reading and writing data to a memory cell are identified, the analysis of the memory requirements recited in the HDL description (step 204 of FIG. 7) proceeds, the steps of which are presented in the flow chart of FIG. 8. The process begins in step 212 and the selection of a parameter to check, e.g., the number of words specified in the description for the memory cell. Step 214 then determines whether the hardware requirement specified for the selected parameter matches the behavioral description, i.e., whether the memory cell can be generated with the specified number of words. If not, an error is indicated in step 216. If there is a match, step 218 then determines if there are more parameters to check, and when there are more parameters, the process returns to step 212. Once all the parameters have been checked, the process continues with step 220 in which the list of write operations identified in step 200 (FIG. 7) are scanned and any mergable write operations are listed. Mergable write operations are those that do not take place at the same point in time (i.e., the conditions for doing writes are mutually exclusive). If there are mergable write operations as determined by step 222, a heuristic is used to select one of listed mergable operations and the merge is performed in step 224.

By way of example, a suitable heuristic is to select the two write operations that have the most data to be written in common. If there are multiple merges that meet this criteria, the first in the list is selected. For example, in block 194 of FIG. 5a, the data list for the write to address "writeAddr" includes the two data items dataIn1 and dataIn2. If a write to a different address were to have data items dataIn1 and dataIn3 in the data list, the two writes have one data item in common. The two individual writes selected are then removed from the list of writes and replaced with a single new write which combines the write conditions of the two that were merged. In addition, the heuristic should then check whether this new write can be merged with any others, and if so, add it to the list of mergable writes. Since each write in the write list corresponds to a write port, as writes in the write list are merged, fewer and fewer write ports are required.

Once the list of mergable writes has been exhausted, the process continues with step 226 in which the number of write ports are counted. If it is determined in step 228 that the number of write ports exceeds the number of write ports available on the hardware model for the memory cell, an error is indicated in step 230. If there is no excess of write ports, the process then continues in a similar manner with respect to the read ports.

In step 232, the read operations as identified by step 202 (FIG. 7) are scanned and a list of mergable read operations is created. Read operations that do not take place at the same point in time (i.e., the conditions for doing the reads are mutually exclusive) are considered mergable. For example, in block 194 of FIG. 5a, the read from address addr1 takes place when (s1='1' or s2='0') and the read from address addr1+addr2 takes place when not (s1='1' or s2='0'). These two read operations will never be performed at the same point in time and hence can be merged. If a mergable operation exists as determined in step 234, a heuristic is used in step 236 to select the two read operations that have the most addresses to be read from in common. If there are multiple merges that meet this criteria, the first in the list is selected. For example, after merging the two reads for address addr1 and address addr1+addr2 (as mentioned above), there would be a new read in the list with addresses addr1 and addr1+addr2. If another read in the list has address addr1, there would be one address in common. The two individual reads selected are then removed from the list of reads and replaced with a single new read which combines the read conditions of the two that were merged. In addition, the heuristic should check whether this new read can be merged with any others, and if so, add it to the list of mergable reads. With each read in the read list corresponding to a read port, as reads in the read list are merged, fewer and fewer read ports are required.

Once all of the read operation merges have been completed, the process continues with step 238 and the counting of the number of read ports needed. If this number exceeds the hardware model number as determined in step 240, again an error is indicated. If there is not a discrepancy, step 242 continues the process with an analysis of all of the address equations to determine clocking requirements for the circuit.

In step 244, a determination is made as to whether all of the write operations are asynchronous. If they are not all asynchronous, step 246 then determines whether they are all synchronous. If there is no consistency among all of the write operations, an error is indicated in step 248. However, if all of the operations are asynchronous as determined by step 244, the write operations are set as an asynchronous type in step 250 before the processing returns to step 206 (FIG. 7). On the other hand, if all of the writes are synchronous as determined by step 246, step 252 determines whether the writes are all the same synchronous type, i.e., all use the same clock and same clock edge. If not, an error is indicated by step 248. If all are the same type, step 254 adds the clock to the data structure. The type of write operation is then set to synchronous in step 256 before the process returns to step 206 of FIG. 7 to determine a match between the hardware description and the hardware components being employed.

Figure 9:
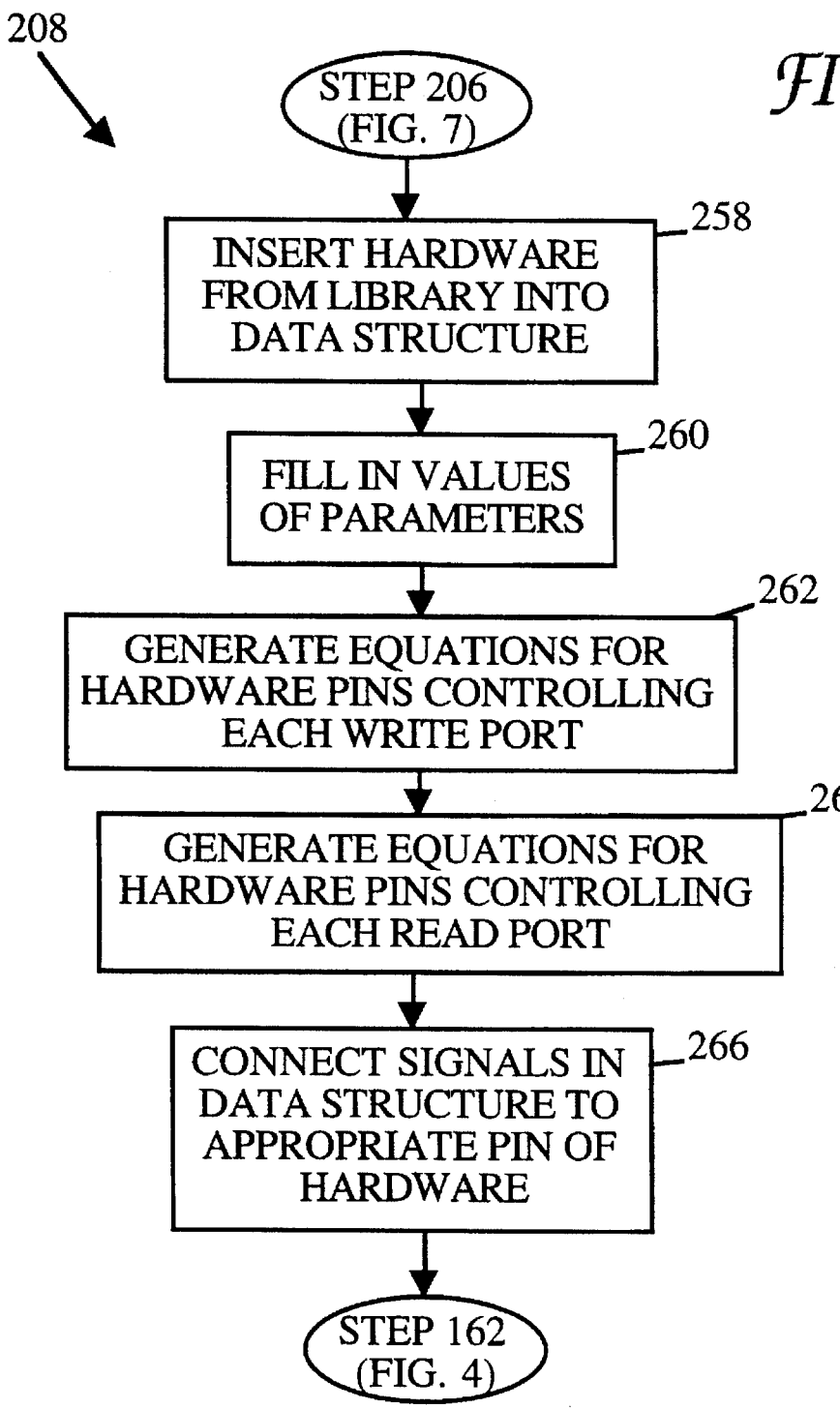
FIG. 9 is a flow chart illustrating the "instantiate memory cell" step 208 of FIG. 7 in greater detail.

When there is a match as determined in step 206 of FIG. 7, the processing for instantiating the memory cell into the data structure (step 208 of FIG. 7) is performed as presented in the flow chart of FIG. 9. The processing begins in step 258 with the insertion of the hardware model from the library into the data structure, which is shown in FIG. 12. In step 260, the values for all of the parameters of the memory cell are inserted, e.g., these parameters include number of words, number of read ports, number of write ports, and synchronous/asynchronous type. Equations for the hardware pins for controlling each write port are generated in step 262, the details of which are presented in FIG. 10. The equations for each hardware pin controlling each read port are generated in step 264, which is more fully described with reference to the flow chart of FIG. 11. Following the generation of all of these control equations, the connection of the signals in the data structure to the appropriate pin of the hardware model is performed in step 266 (by techniques standard in the art) before the process returns to step 162 of FIG. 4.

Figure 10:
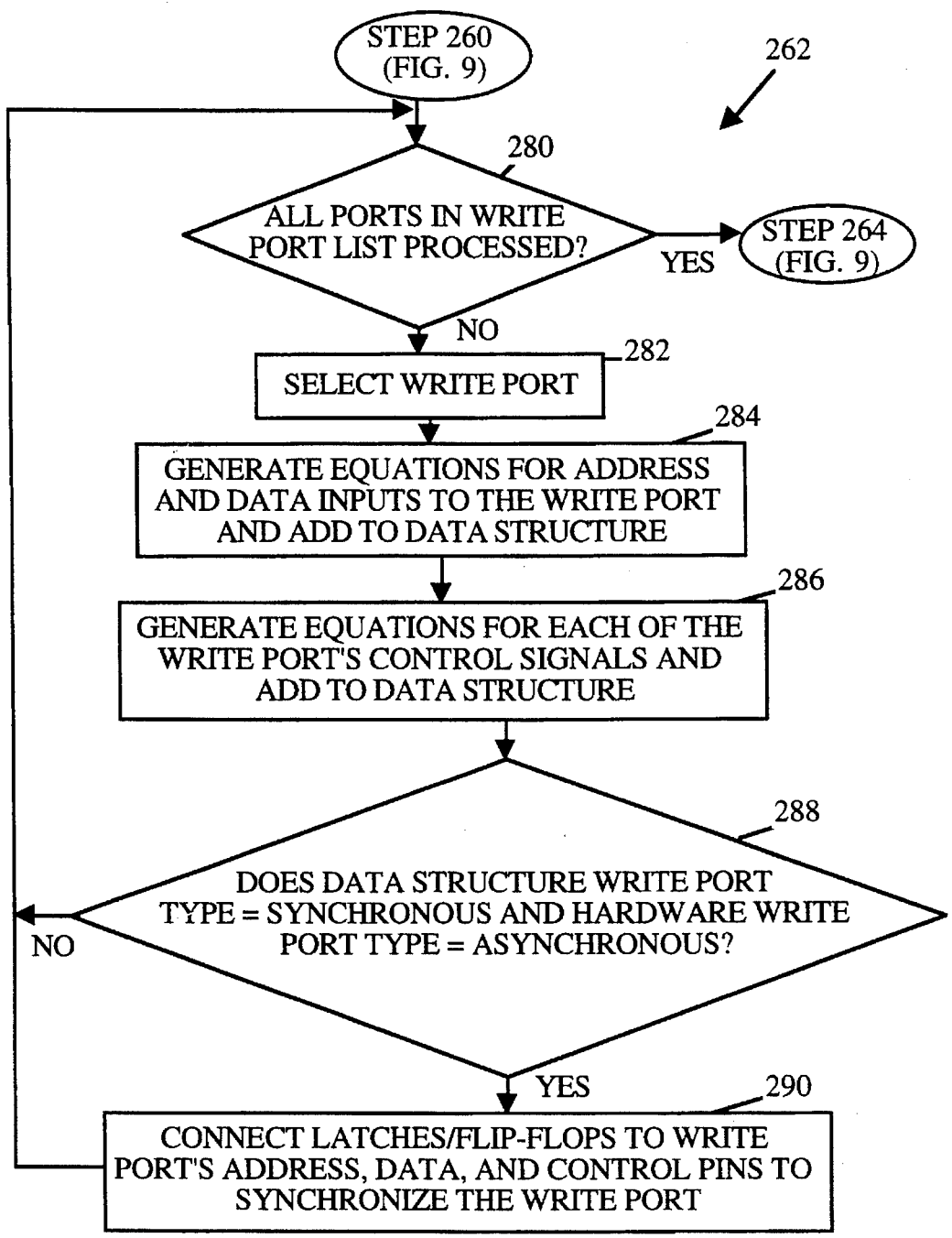
FIG. 10 is a flow chart illustrating the "generate equations for each write port" step 262 of FIG. 9 in greater detail.

The process for generating the equations for the hardware pins for controlling each write port (step 262 of FIG. 9), which includes synchronizing the ports if necessary, is presented in FIG. 10. It begins in step 280 with the determination of whether all of the write ports have been processed. If so, the process returns to step 264 of FIG. 9. If not, processing continues with step 282 and the selection of a write port. The equations for the address and data inputs for the write port are then generated and added to the data structure in step 284. The equations for each of the write port's control signals are then generated and added to the data structure in step 286. These equations are generated so that write operations are performed by the hardware as specified by the HDL behavior. Step 288 then determines whether the write port type is synchronous and the hardware write port is asynchronous. If so, latches and/or flips-flops are connected to the write port's address, data, and control pins in step 290 to synchronize the write port, as described with the register file shown in FIG. 10b. Upon completion of this synchronization or if step 288 is negative, i.e., there is no mismatch of types, the process returns to step 280 and continues until all of the write ports have been processed.

Figure 10A:
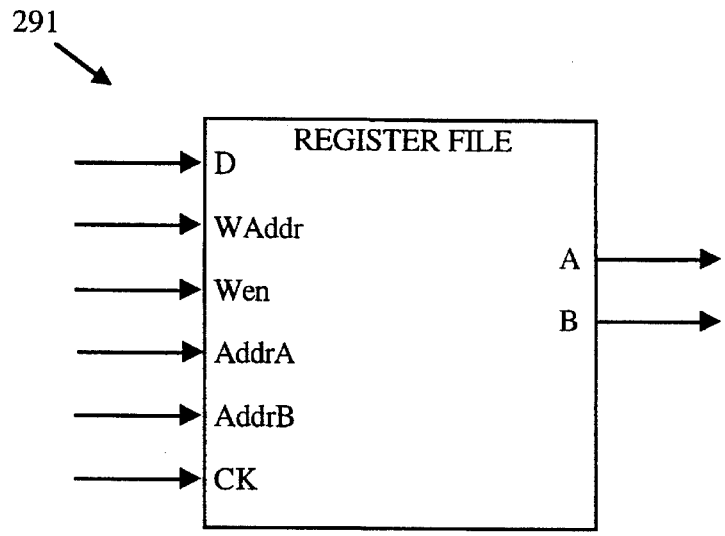
FIG. 10a illustrates an example of a synchronous register file.

FIGS. 10a and 10b illustrate examples of a synchronous and an asynchronous hardware representation, 291 and 293 respectively, of a register file structure. For register file 291, the hardware port descriptions for this two read port, one write port structure include CK as a clock input port, D as a data input port for the write port, WADDR as an address port for writing D, WEN as a write enable port, ADDRA as an address port for read port A, ADDRB as an address port for read port B, A as a data output port for read port A, and B as a data output port for read port B. For this structure, data D is written to the address of WADDR on the rising edge of clock input at CK and when WEN is high or '1'. New values appear at A and B on each rising edge of the clock input CK. Table 3 illustrates the results of the processing as presented in FIG. 9 with the representation of each signal in the data structure for each hardware pin of the register file structure along with the equation assigned to each signal based on the hardware description of Table 1.

TABLE 3

| Hardware Pin | Signal Name in Data Structure | Equation |
| --- | --- | --- |
| CK | regFile1_clk | clk |
| D | regFile1_dataIn | If s2='1', then dataIn1, else dataIn2 |
| WADDR | regFile1_wa | writeAddr |
| WEN | regFile1_wen | If s2='1', or s2='0' & s1='0' then '1', else '0' |
| ADDRA | regFile1_ra1 | addr1 |

TABLE 3-continued

| Hardware Pin | Signal Name in Data Structure | Equation |
| --- | --- | --- |
| ADDRB | regFile1_ra2 | if s1='1' or s2='0' then addr2, else addr1+addr2 |
| A | regFile1_rd1 | |
| B | regFile1_rd2 | |

Ports A and B lack equations since they are output ports. However, they are used in other equations. For example, an equation for out1 before the connection of the signals in the data structure to the hardware is if s1='1' or s2='0' then regfile(addr1)+regfile(addr2) else regfile(addr1+addr2). After the connection of the signals to the hardware, the equation appears as if s1='1' or s2='0' then regfile1_rd1+ regfile1_rd2 else regfile1 _rd2.

For register file 293 in FIG. 10b, the hardware port descriptions for this two read port, one write port structure include D as a data input port for the write port, WADDR as an address port for writing D, WEN as a write enable port, ADDRA as an address port for read port A, ADDRB as an address port for read port B, A as a data output port for read port A, and B as a data output port for read port B. For this structure, data D is written to the address of WADDR when WEN is '1'. New values appear at port A shortly after ADDRA changes, and similarly, new values appear at port B shortly after ADDRB changes. As shown, the clock input CK in the hardware model of FIG. 10a identifies the register file as synchronous, while that of FIG. 10b lacks a clock input, thus rendering it asynchronous. Because the HDL description of the memory cell for the circuit requires synchronicity, the register file model presented in FIG. 10b must be made synchronous in order to be implemented with the circuit described. This is done by the incorporation of control logic in the form of a flip-flop I1 and latches I2, I3 to the register file I4.

Table 4 illustrates the results of processing as presented in FIG. 9 with the representation of each signal in the data structure for each hardware pin of the register file structure (identified in the table as instance name pin name, e.g., pin D of instance I3 is shown as I3.D) and the control logic components along with the equation assigned to each signal based on the hardware description of Table 1. The addition of control logic such as that shown results from a positive determination in step 288 (FIG. 10).

TABLE 4

| Hardware Pin | Signal Name in Data Structure | Equation |
| --- | --- | --- |
| I1.D | regFile1_dataIn | If s2='1', then dataIn1, else dataIn2 |
| I3.D | regFile1_wa | writeAddr |
| I2.D | regFile1_wen | If s2='1', or s2='0' & s1='0' then '1', else '0' |
| I4.ADDRA | regFile1_ra1 | addr 1 |
| I4.ADDRB | regFile1_ra2 | if s1='1' or s2='0' then addr2, else addr1+addr2 |
| I4.A | regFile1_rd1 | |
| I4.B | regFile1_rd2 | |
| I1.CLK | clk | |
| I2.EN | clk | |
| I3.EN | clk | |

Again, ports A and B lack equations since they are output ports. However, they are used in other equations. For example, an equation for out1 before the connection of the signals in the data structure to the hardware is if s1='1' or s2='0' then regfile(addr1)+regfile(addr2) else regfile(addr1+ addr2). After the connection of the signals to the hardware, the equation appears as if s1='1' or s2='0' then regfile1__ rd1+regfile1__rd2 else regfile1__rd2. Further, as a result of the incorporation of control logic, the data is written in the register file 293 of FIG. 10b when the Wen signal is '1' and on the rising edge of the clock signal, since the Wen signal, the WADDR signal, and the D signal are now synchronized to the clock signal with the use of the control logic.

Figure 11:
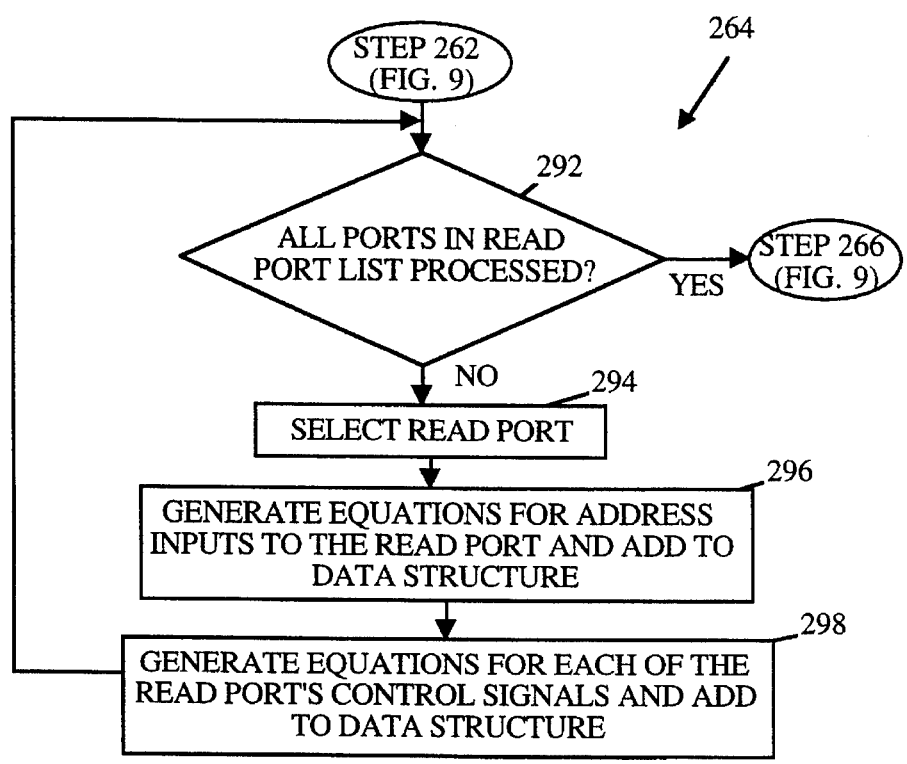
FIG. 11 is a flow chart illustrating the "generate equations for each read port" step 264 of FIG. 9 in greater detail.
Figure 12:
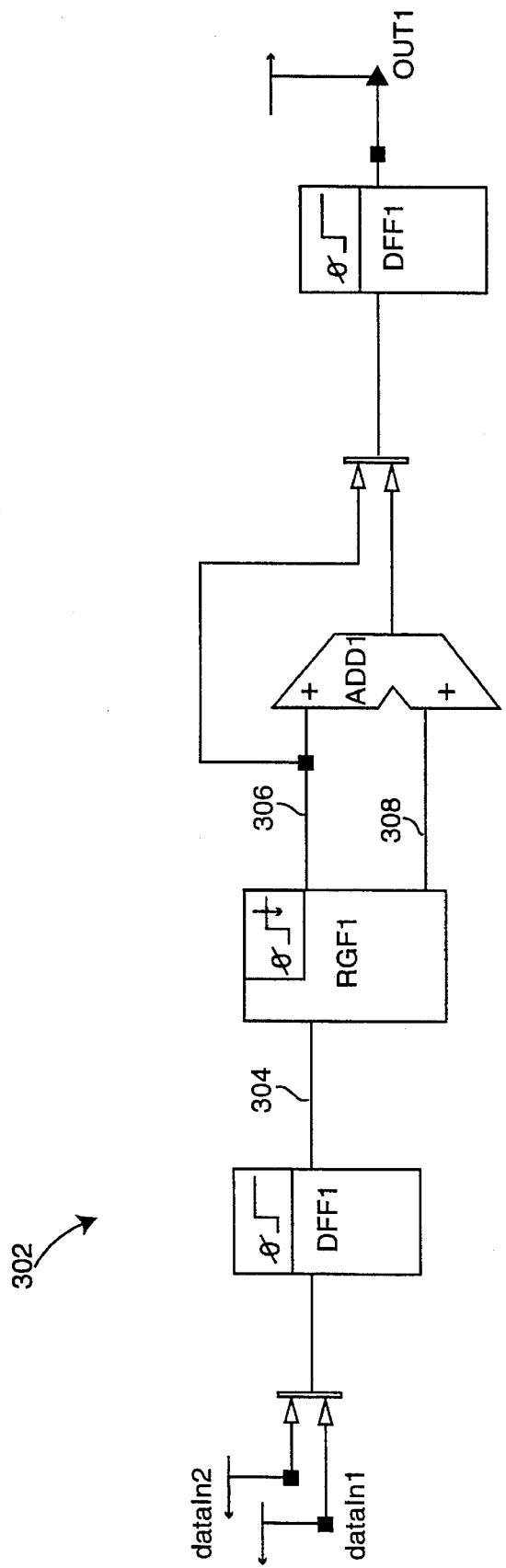
FIG. 12 illustrates an example of an output schematic from the datapath synthesis step 172 of FIG. 4.

The processing of the read ports corresponding to step 264 of FIG. 9 is presented in FIG. 11. It begins in step 292 with the determination of whether there are any read ports that are unprocessed. While there are unprocessed read ports remaining, a selection of a read port is made in step 294. Equations for the address inputs are then generated in step 296 and added to the data structure. Then, in step 298, equations for the read port's control signals are generated and added to the data structure before the process returns to step 292. Once all of the read port's have been processed, the method continues with step 266 of FIG. 9 in which the generated equations for the hardware pins are used to connect the signals to the appropriate pins.

Once the memory synthesis is completed, the datapath synthesis proceeds (step 172 of FIG. 4). For a memory cell that is a register file structure, datapath synthesis results in the register file being incorporated in the datapath for the circuit, as mentioned with reference to FIG. 3. FIG. 12 shows the results of the addition of a register file RGF1 into a data structure 302. In this schematic, ADD1 represents an adder, while the DFF1 blocks represent flip-flops incorporated from the datapath cell library, for which library VCC4DP4 is suitable. Data is input on lines dataIn1 and dataIn2 and output on line OUT1. For RGF1, line 304 indicates that there is one write port and lines 306 and 308 indicate that there are two read ports in accordance with the register file, DPRGF010H, specified.

Figure 13:
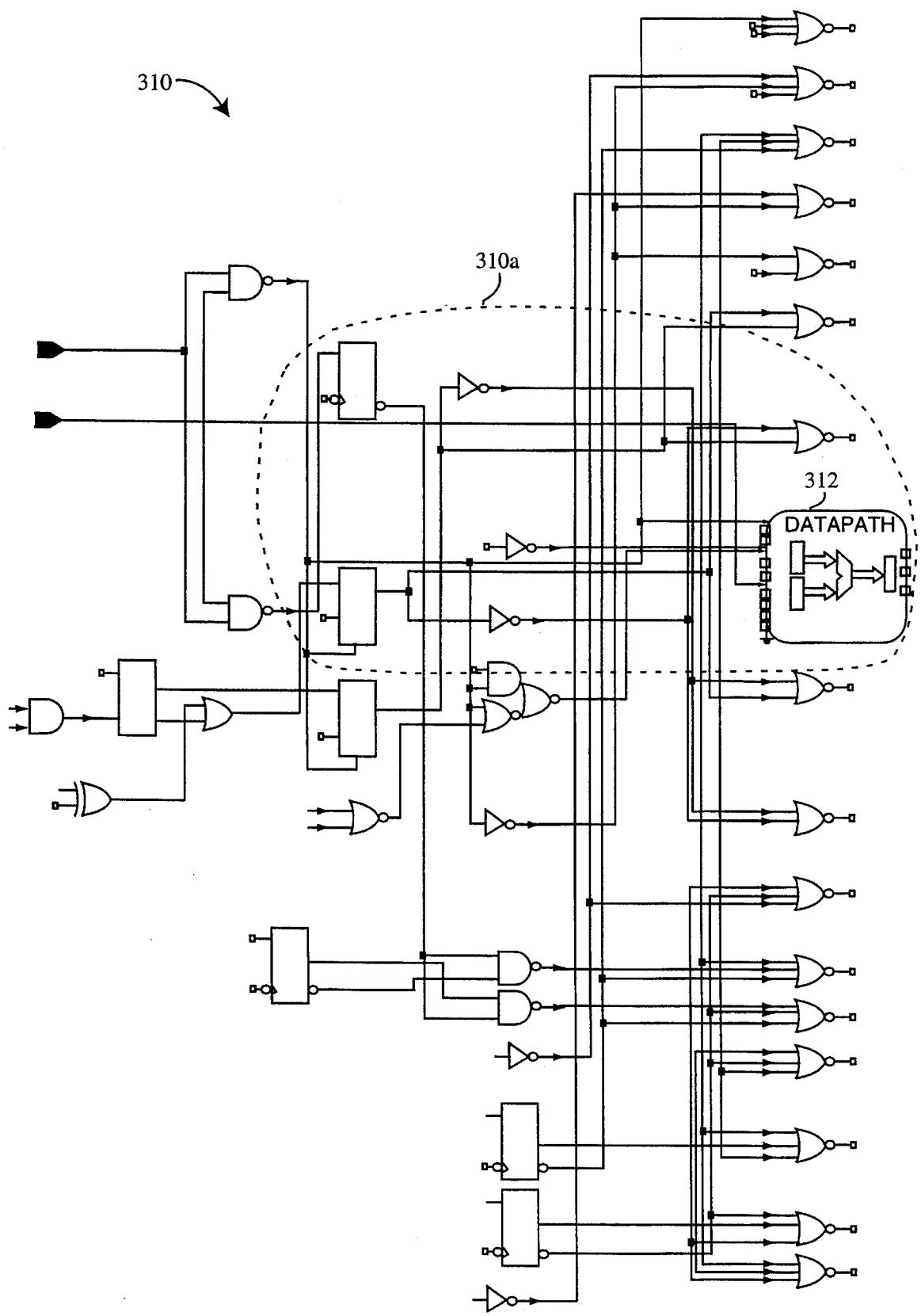
FIG. 13 illustrates an example of an output schematic from the random logic synthesis step 176 of FIG. 4.

This datapath is then incorporated into an overall circuit including logic cells, as shown in schematic 310 in FIG. 13, based on the synthesized netlist resulting from the random logic synthesis (step 176 of FIG. 4). The random logic adds the control for all of the various inputs/outputs of the overall circuit including the register file and datapath. An expanded view of a portion 310a of this circuit including the datapath 312 is shown in FIG. 14.

Figure 14:
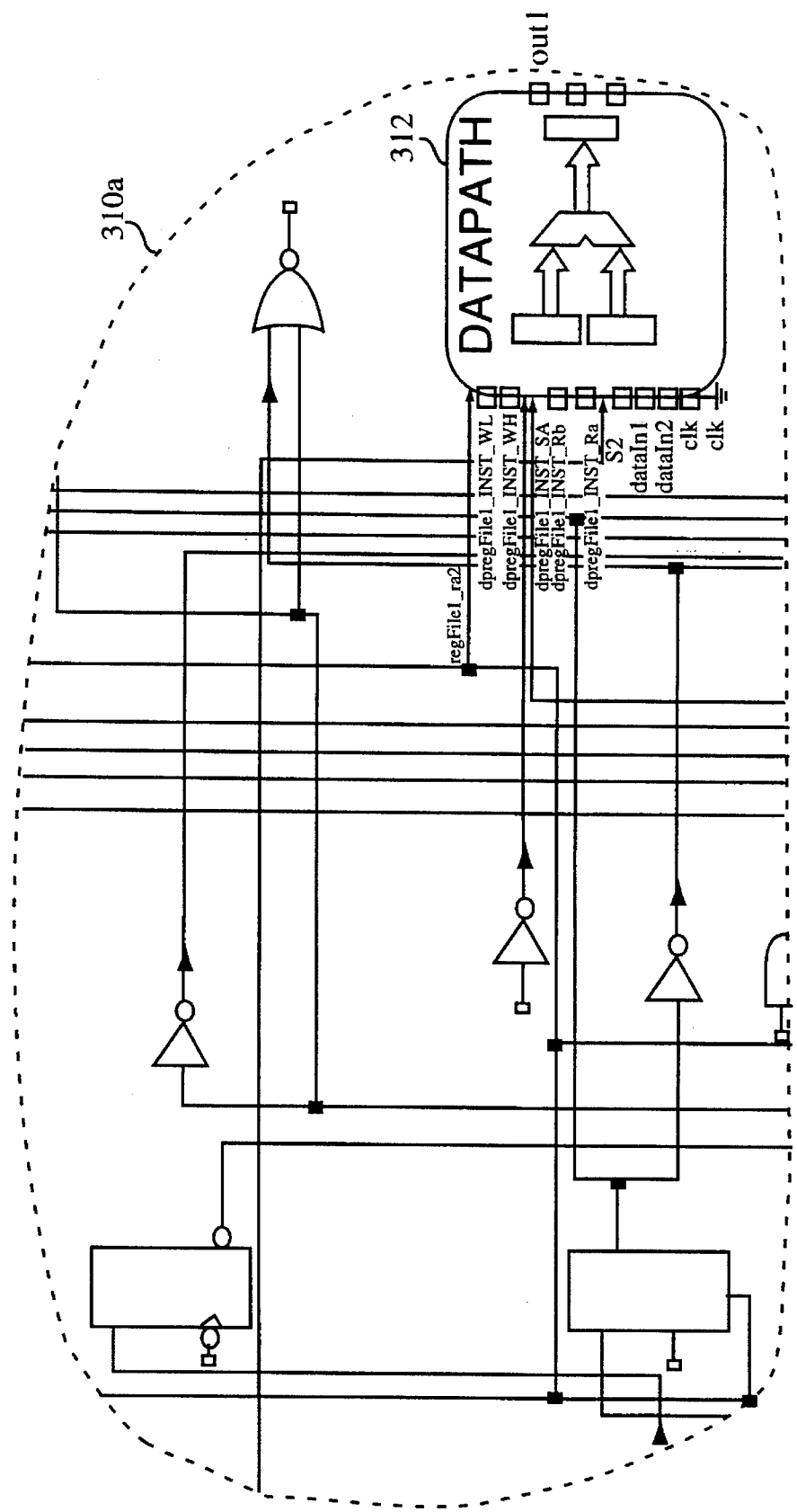
FIG. 14 is an enlarged view of section 301a of FIG. 13.

In FIG. 14, the expanded portion 310a shows the signals associated with datapath 312 for the register file structure. These signals correspond to those listed in the library specification for the DPRGF010H register file cell used as an example throughout this specification and to those specified by the hardware description of Table 1. As shown, clock input is represented as line clk, and data inputs are indicated by lines dataIn1 and dataIn2. Signal s2 is further shown along with the read enable signals, dpRegFile1__INST__RA and dpRegFile1__INST__RB, for ports A and B, respectively, and the read address signal REGFILE__ra2. Write enable signals are represented by dpRegFile1__INST__WH and dpRegFile1__INST__WL, and the port A selection signal is represented by dpRegFile1__INST__SA. The output signal is shown as OUT1.

It should be understood that the present invention may be embodied in many other specific forms without departing from the spirit or scope of the invention. Particularly, the invention has been described in the context of a particular register file from a particular library of memory cells. Other suitable libraries and cells are equally capable of being used as internal memory structures for the present invention. Therefore, the present examples are to be considered as illustrative and not restrictive, and the invention is not to be limited to the details given herein, but may be modified within the scope of the appended claims.

We claim:

1. A method for making an integrated circuit with an internal memory structure comprising the steps of:

developing a set of circuit specifications, including circuit specifications of an internal memory structure and circuit specifications of additional logic coupled to said internal memory structure, for an integrated circuit;

describing said set of circuit specifications in a hardware description language and inputting said hardware description language into a digital computer system;

synthesizing on said digital computer system a netlist including descriptions of both said internal memory structure and said additional logic from said hardware description language which specifies circuitry of said integrated circuit including both said internal memory structure and said additional logic; and producing an integrated circuit comprising a semiconductor die including said circuitry of said integrated circuit, said semiconductor die having a plurality of I/O pads, a package enclosing said integrated circuit die, a plurality of leads extending from said package, and a plurality of conductors coupling said plurality of I/O pads of said semiconductor die to said plurality of leads.

2. A method as recited in claim 1 further comprising the steps of:

laying out on said digital computer system at least portions of said circuitry of said integrated circuit; and producing at least one integrated circuit mask based upon said laying out step;

wherein said integrated circuit is produced, at least in part, with said at least one integrated circuit mask.

3. A method as recited in claim 2 wherein said step of laying out comprises laying out at least portions of said circuitry for a gate array circuit.

4. A method as recited in claim 2 wherein said step of laying out comprises laying out at least portions of said circuitry for a standard cell circuit.

5. A method as recited in claim 2 wherein said step of laying out comprises laying out at least portions of said circuitry for a bit slice layout.

6. A method as recited in claim 1 wherein said step of synthesizing further comprises the substeps of:

converting on said digital computer said hardware description into an internal signal list including at least one internal memory structure;

scanning on said digital computer said internal list for said indicia and synthesizing at least one internal memory structure for each instance of said indicia;

synthesizing on said digital computer said additional logic from said internal signal list and combining said additional logic with said at least one internal memory structure to create a netlist which specifies circuitry of said integrated circuit including said internal memory structure.

7. A method as recited in claim 6 wherein said step of synthesizing on said digital computer from said internal signal list includes the steps of:

synthesizing a datapath from said internal signal list;

synthesizing random logic from said internal signal list; and combining said datapath and said random logic with said internal memory structure to create said netlist.

8. A method as recited in claim 7 wherein said indicia includes a 2-D bit array designation.

9. A method as recited in claim 8 wherein said step of synthesizing at least one internal memory structure utilizes a memory cell library.

10. A method as recited in claim 9 wherein said step of synthesizing a datapath utilizes a datapath cell library.

11. A method as recited in claim 10 wherein said step of synthesizing random logic utilizes a standard cell/gate array library.

12. A method as recited in claim 8 wherein said synthesizing of at least one internal memory structure further comprises the steps of:

extracting conditions for writing data to said at least one internal memory structure;

extracting data to be written in said at least one internal memory structure; and adding said conditions and said data to said netlist.

13. A method as recited in claim 12 further comprising the steps of extracting conditions for reading data from said at least one internal memory structure and adding said conditions to said netlist.

14. A method as recited in claim 13 further comprising the steps of:

analyzing said indicia to determine compatibility of said indicia with said at least one internal memory structure; and instantiating said at least one internal memory structure into said netlist when there is compatibility.

15. A method for synthesizing a netlist from a hardware description of an integrated circuit that includes an internal memory structure comprising the steps of:

inputting a hardware description of a set of specifications of an integrated circuit that includes an internal memory structure into a digital computer;

converting on said digital computer said hardware description into an internal signal list including indicia of at least one internal memory structure;

scanning on said digital computer said internal list for said indicia and synthesizing at least one internal memory structure for each instance of said indicia;

synthesizing on said digital computer additional logic from said internal signal list and combining said additional logic with said at least one internal memory structure to create a netlist which specifies circuitry of said integrated circuit including said at least one internal memory structure.

16. A method as recited in claim 15 wherein said step of synthesizing on said digital computer from said internal signal list includes the steps of:

synthesizing a datapath from said internal signal list;

synthesizing random logic from said internal signal list; and combining said datapath and said random logic with said internal memory structure to create said netlist.

17. A method as recited in claim 16 wherein said indicia includes a 2-D bit array designation.

18. A method as recited in claim 17 wherein said step of synthesizing at least one internal memory structure utilizes a memory cell library.

19. A method as recited in claim 18 wherein said step of synthesizing a datapath utilizes a datapath cell library.

20. A method as recited in claim 19 wherein said step of synthesizing random logic utilizes a standard cell library.

21. A method as recited in claim 17 wherein said synthesizing of at least one internal memory structure further comprises the steps of:

extracting conditions for writing data to said at least one internal memory structure;

extracting data to be written in said at least one internal memory structure; and adding said conditions and said data to said netlist.

22. A method as recited in claim 21 further comprising the steps of extracting conditions for reading data from said at least one internal memory structure and adding said conditions to said netlist.

23. A method as recited in claim 22 further comprising the steps of:

analyzing said indicia to determine compatibility of said indicia with said at least one internal memory structure; and instantiating said at least one internal memory structure into said netlist when there is compatibility.

24. A method as recited in claim 23 wherein said step of analyzing further comprises determining compatibility between each parameter specified in said hardware description with each parameter of said at least one internal memory structure.

25. A method as recited in claim 24 wherein when compatibility is determined between said hardware description parameters and said at least one internal memory structure parameters, a list of mergable write operations is made.

26. A method as recited in claim 25 wherein when said list of mergable write operations exists, a heuristic is used to select and merge a write operation from said list.

27. A method as recited in claim 26 wherein when said list is exhausted of mergable write operations, a comparison is made between a number of write ports needed for said write operations and a number of write ports available on said at least one internal memory structure, wherein when said number of write ports needed exceeds the number of write ports available, an error is indicated.

28. A method as recited in 27 wherein when said number of write ports needed does not exceed said number of write ports available, a list of mergable read operations is made.

29. A method as recited in claim 28 wherein when said list of mergable read operations exists, a heuristic is used to select and merge a read operation from said list.

30. A method as recited in claim 29 wherein when said list is exhausted of mergable read operations, a comparison is made between a number of read ports needed for said read operations and a number of read ports available on said at least one internal memory structure, wherein when said number of read ports needed exceeds the number of read ports available, an error is indicated.

31. A method as recited in 30 wherein when said number of read ports needed does not exceed said number of read ports available, an analysis of address equations is made to determine clocking for said at least one internal memory structure.

32. A method as recited in claim 31 wherein when said analysis of address equations determines that all write operations are asynchronous, a type for said at least one internal memory structure is set to asynchronous.

33. A method as recited in claim 31 wherein when said analysis of said address equations determines that all write operations are a same type of synchronous operation, a clock is added to said data structure and a type for said at least one internal memory structure is set to synchronous.

34. A method as recited in claim 23 wherein said step of instantiating further comprises the substeps of:

inserting said at least one memory structure from said memory cell library into a data structure for said circuit;

adding in values for parameters of said at least one memory structure from said hardware description;

generating equations for hardware pins to control each write port of said at least one internal memory structure;

generating equations for hardware pins to control each read port of said at least one internal memory structure; and connecting each signal in said data structure to an appropriate pin of said at least one internal memory structure.

35. A method as recited in claim 34 wherein said step of generating equations to control each write port further comprises the substeps of:

adding generated equations for address and data inputs of each write port to said data structure;

adding generated equations for control signals of each write port to said data structure; and determining compatibility of synchronicity between said data structure write port and said at least one internal memory structure, wherein when there is no compatibility, additional logic elements are connected to address, data, and control pins of said at least one internal memory structure to synchronize said write port.

36. A method as recited in claim 34 wherein said step of generating equations for hardware pins to control each read port further comprises the substeps of:

adding generated equations for address inputs of each read port to said data structure; and adding generated equations for control signals of each read port to said data structure.

37. An apparatus for designing integrated circuits comprising:

a central processing unit (CPU);

a user input coupled to said CPU for entering a hardware description of an integrated circuit that includes an internal memory structure and additional logic;

a hardware description processor implemented on said CPU to create mask generation data from said hardware description that can be used to make an integrated circuit including both said internal memory structure and said additional logic;

a mask generator for making at least one integrated circuit mask from said mask generation data.

38. An apparatus as recited in claim 37 wherein said hardware description processor further includes conversion means to convert said hardware description into an internal signal list including indicia of said internal memory structure.

39. An apparatus as recited in claim 38 wherein said hardware description processor further comprises a synthesizer means for producing a netlist of said integrated circuit including said internal memory structure from said hardware description.

40. An apparatus as recited in claim 39 wherein said synthesizer means further synthesizes a datapath and random logic from said internal signal list and combines said datapath and said random logic with said internal memory structure for said netlist.

41. An apparatus as recited in claim 40 wherein said synthesizer means utilizes a memory cell library, a datapath cell library, and a standard cell/gate array library to produce said netlist.

42. An apparatus as recited in claim 38 wherein said indicia of said internal memory structure includes a 2-D bit array.

43. An apparatus as recited in claim 37 wherein said mask generator is coupled to said CPU.

* * * * *